(12) United States Patent
Liu et al.

(10) Patent No.: US 7,678,586 B2
(45) Date of Patent: Mar. 16, 2010

(54) STRUCTURE AND METHOD TO PREVENT CHARGE DAMAGE FROM E-BEAM CURING PROCESS

(75) Inventors: Huang Liu, Singapore (SG); Bei Chao Zhang, Singapore (SG); Wuping Liu, Singapore (SG); John Leonard Sudijono, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 243 days.

(21) Appl. No.: 11/297,485

(22) Filed: Dec. 8, 2005

(65) Prior Publication Data

US 2007/0134941 A1 Jun. 14, 2007

(51) Int. Cl.
*H01L 21/00* (2006.01)
(52) U.S. Cl. .......................................... 438/5; 257/758
(58) Field of Classification Search .................. 257/758; 438/5
See application file for complete search history.

(56) References Cited

U.S. PATENT DOCUMENTS

| 4,647,818 | A | * | 3/1987 | Ham | 315/111.21 |
|---|---|---|---|---|---|
| 5,003,178 | A | * | 3/1991 | Livesay | 250/492.3 |
| 5,989,983 | A | | 11/1999 | Goo | |
| 6,452,275 | B1 | * | 9/2002 | Chung | 257/759 |
| 6,607,991 | B1 | | 8/2003 | Livesay | |
| 6,613,666 | B2 | | 9/2003 | Ma | |
| 6,703,302 | B2 | | 3/2004 | Miyajima | |
| 2003/0232495 | A1 | | 12/2003 | Moghadam | |
| 2004/0101632 | A1 | | 5/2004 | Zhu | |
| 2004/0137758 | A1 | | 7/2004 | Li | |
| 2004/0137760 | A1 | | 7/2004 | Onishi | |

* cited by examiner

*Primary Examiner*—W. David Coleman
*Assistant Examiner*—Sonya D McCall-Shepard
(74) *Attorney, Agent, or Firm*—Horizon IP Pte Ltd (57) ABSTRACT

An example embodiment is a method of curing a film over a semiconductor structure. We provide a semiconductor structure comprised of a substrate and an interconnect structure. We provide a film over the semiconductor structure. We provide an electron source, an anode grid between the electron source and the semiconductor structure. We cure the film by exposing the film to an electron beam from the electron source that passes through the anode grid. We control the electron beam by controlling the bias voltage between the anode grid and the semiconductor structure. Another embodiment is a tool for curing a film.

22 Claims, 4 Drawing Sheets

FIGURE 4B

STRUCTURE AND METHOD TO PREVENT CHARGE DAMAGE FROM E-BEAM CURING PROCESS

BACKGROUND OF INVENTION

1) Field of the Invention

This invention relates generally to a device and method for e-beam curing films and more particularly a device and method for e-beam curing films such as low-k films or photoresist films in semiconductor devices.

2) Description of the Prior Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, un-doped silicon glass (USG), fluorine-doped silicon glass (FSG), and polytetrafluoroethylene (PTFE), which are all commercially available.

In order to minimize the RC delay, organic porous low-k materials are recommended to use as dielectric materials for BEOL interconnect for 65 nm technology and below. One big challenge for organic porous low-k film development is how to improve the mechanical strength while still maintaining low dielectric constant of organic porous films. An effective method to reduce the k value is to introduce pores into the film. As a result, low k films often exhibit poor mechanical strength (e.g., hardness), which may hinder the integration of the films into the manufacture of the device. Plasma post treatment is currently being used to increase mechanical strength of low k films. However, plasma treatment often causes the k value to increase.

A need, therefore, exists for a method for increasing the mechanical strength of low k films without having to increase the k value.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

US20040137760A1: Thin film processing method and system—Inventor: Onishi, Tadashi;—Thin film processing method in chemical vapor deposition apparatus, involves independently controlling output power and time of electron beam irradiated on wafer according to thickness distribution of film on wafer—Assignee: TOKYO ELECTRON LIMITED, Tokyo, Japan.

U.S. Pat. No. 5,989,983: Method of fabricating and curing spin-on-glass layers by electron beam irradiation—SOG layer curing method for use during manufacture of semiconductor device—involves irradiating electron beam at predefined temperature for specific time onto target plate formed with SOG layer—Inventor: Goo, Ju-seon;

US20040137758A1: Inventor: Li, Lihua—METHOD FOR CURING LOW DIELECTRIC CONSTANT FILM USING DIRECT CURRENT BIAS—Depositing low dielectric constant film on substrate for fabrication of integrated circuit by applying direct current bias to at least one of substrate or gas distribution plate to cure low dielectric constant film.

U.S. Pat. No. 6,607,991: Livesay et al. Method for curing spin-on dielectric films utilizing electron beam radiation—Spin-on dielectric material layer modification for semiconductor device, involves irradiating dielectric layer simultaneously with large area electron beam and heat until sufficient electron dose is accumulated.

US20030232495A1: Moghadam et al.—Methods and apparatus for E-beam treatment used to fabricate integrated circuit devices—Deposition of low dielectric constant film on substrate comprises depositing film comprising silicon, carbon, oxygen and hydrogen in chemical vapor deposition chamber, and exposing film to electron beam to increase its hardness.

U.S. Pat. No. 6,703,302: Inventor: Miyajima, Hideshi;—Method of making a low dielectric insulation layer—Fabrication of semiconductor device by heating silicon-containing low dielectric constant insulating film while irradiating with electron beam, and exposing the film to gas which promotes bond formation of silicon atoms.

U.S. Pat. No. 6,613,666—Ma, Shawming—Method of reducing plasma charging damage during dielectric etch process for dual damascene interconnect structures—Reduction of plasma-induced charging damage during etching of trench in dielectric layer by applying protective layer of conductive material on electrical contact opening and etching trench overlying electrical contact opening US20040101632A1: Inventor: Zhu, Wen H.;—method for curing low dielectric constant film by electron beam—Deposition of low dielectric constant film on substrate comprises depositing film comprising silicon, carbon, oxygen and hydrogen in chemical vapor deposition chamber, and exposing film to electron beam to increase its hardness.

SUMMARY OF THE EXAMPLE EMBODIMENTS OF THE INVENTION

Some example embodiments of the present invention provide a structure and a method of curing a film which can characterized as follows.

An example embodiment is a method of curing a film over a semiconductor structure that comprises the steps of:
  providing a semiconductor structure comprised of a substrate and an interconnect structure; and providing a film over the semiconductor structure;
  providing an electron source, an anode grid between the electron source and the semiconductor structure;
  curing the film by exposing the film to an electron beam from the electron source that passes through the anode grid; and controlling the electron beam by controlling the bias voltage between the anode grid and the semiconductor structure.

Another example embodiment of a method of curing a fabrication of a film over a substrate that comprises the steps of:
  a) providing a semiconductor structure comprised of a substrate; an interconnect structure over the substrate; a film over the semiconductor structure;
    (1) the film is comprised of an organic low K material with a dielectric constant less than 3.0 or a photoresist material;

(2) the interconnect structure is comprised of a structure selected from the group consisting of a metal line, a via plug, a passive device, a chip protection structure, a moisture oxidation barrier, a guard ring, a crack-stop metal bar;

b) providing an electron source, an anode grid between the electron source and the semiconductor structure;

c) curing the film by exposing the film to an electron beam from the electron source that passes through the anode grid; and controlling the electron beam by controlling the bias voltage between the anode grid and interconnect structure.

d) and controlling the electron beam by controlling the voltage bias between the anode grid and the semiconductor structure by measuring the current flow between the anode grid and the semiconductor structure;

(1) controlling the voltage on the and anode grid to minimize the amount of electrons that penetrates totally through the film.

Another example embodiment is a thin film processing system to cure films that is comprised of:

a processing chamber, an electron source, a device holder; an anode grid between the electron source;

the electron source is adapted to send electrons thru the anode grid towards a semiconductor structure over the device holder.

a controller for controlling the bias voltage between the anode grid and a semiconductor structure with an overlying film in the device holder.

In an aspect of this embodiment further includes a current meter to measure the current between the anode grid and the semiconductor structure.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

So that the manner in which the above recited features of the example embodiments of present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE EXAMPLE EMBODIMENTS

A detailed description will now be provided. Various terms as used herein are defined below. To the extent a term used in a claim is not defined below, it should be given the broadest definition persons in the pertinent art have given that term, as reflected in printed publications and issued patents.

Some example embodiments of the invention provide a significant and unexpected improvement in curing the entire film while reducing charge damage by ebeam that penetrates thru the film to affect underlying devices. Some example embodiments of the invention provide a significant and unexpected improvement in hardness, cracking threshold and other mechanical properties of an low k or ultra low dielectric constant film by curing the entire film.

II. Overview of Example Embodiments

An example embodiment is a method to e-beam cure a film while minimizing charge damage to FETs and other devices under the film. An embodiment uses feedback from an interconnect/cathode structure that is under the film but over a substrate. The e-beam tool has a anode grid positioned between a electron beam source and the substrate. The dose and energy of the electron beam curing the film is controlled by feedback from the current measured by the interconnect structure.

The electric field between floating anode and wafer Cu interconnect layer is used to reduce/control electron speed to make sure there are minimum electrons hitting any Cu interconnect during curing.

Figure 1:
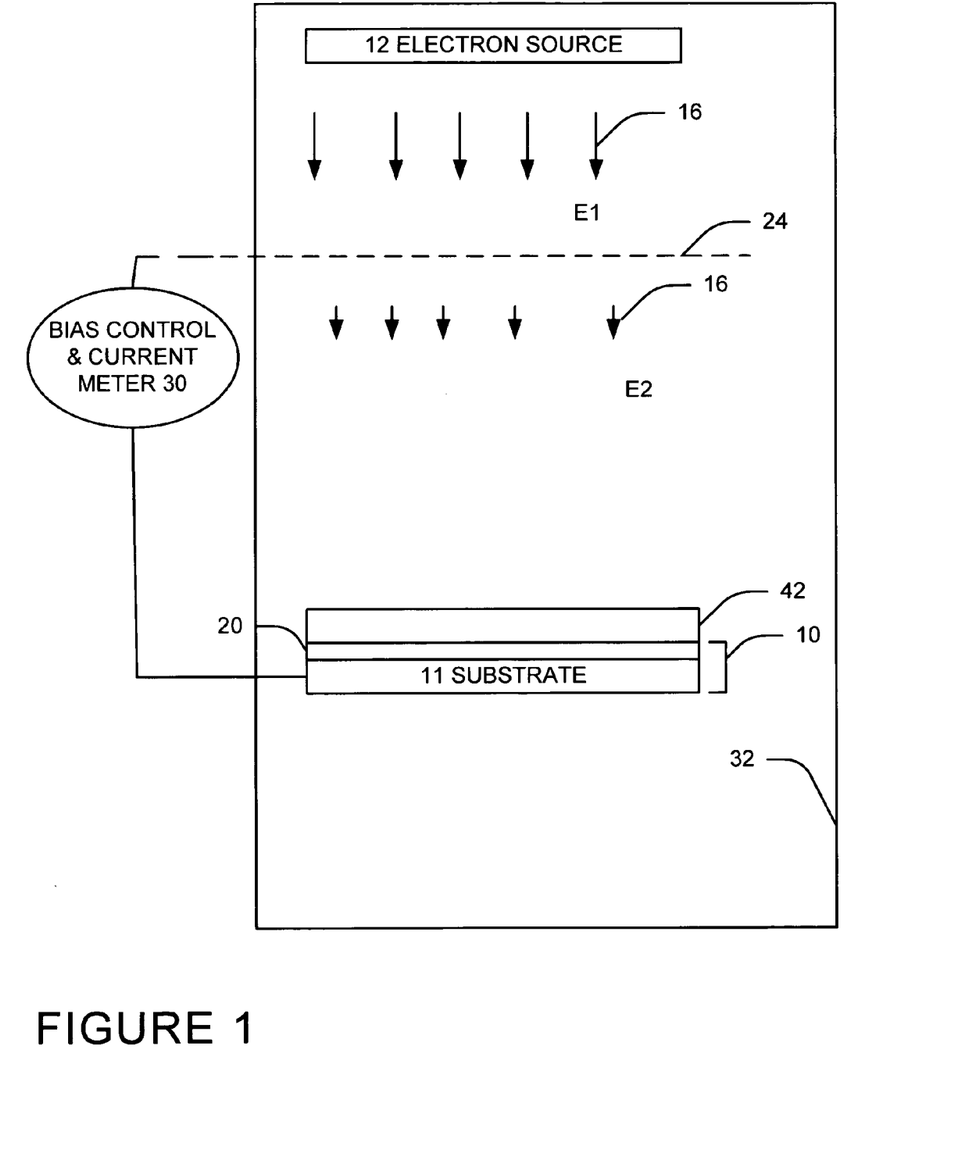
FIG. 1 is schematic view for illustrating a tool and a method for curing a film according to an example embodiment of the present invention.

In a first general example embodiment shown in FIG. 1, we provide a semiconductor structure 10 comprised of a substrate 11 and an interconnect structure 20. We provide a film 42 over the semiconductor structure 10.

The interconnect structure 20 is only schematically illustrated and is not accurately drawn. The interconnect structure 20 can be comprised of via plug, lines, dual damascene shaped interconnects, one or more levels of conductive interconnects (such as metal lines (M1, M2, etc) and the via plugs that connect the metal layers). The interconnect structure can include cathode structures which are discussed more below. The interconnects or cathode structures are electrically connected to the bias controller 30.

A curing tool is provided having a chamber 32, an electron source 12, an anode grid 24 between the electron source 12 and the semiconductor structure 10. The electron sources can be comprised of electron tubes.

We cure the film (e.g., dielectric layer or photoresist layer) 42 by exposing the film 42 to an electron beam of electrons 16 from the electron source 12 that passes through the anode grid 24. We control the electron beam 16 energy by controlling the bias voltage between the anode grid 24 and the semiconductor structure 10.

The electrons have a first energy E1 before the anode grid 24. The electrons 16 have a second energy E2 after the electron grid. The bias voltage on the grid 24 changes the electron energy.

The anode grid 24 is connected to a bias controller 30 (e.g. voltage controller). The bias controller 30 is connected to the semiconductor structure which acts as a cathode under the film 42.

The bias control 30 can also include a current meter to measure the current between the anode grid and interconnect structure 20. This current, the electrons passing thru the film can be minimized by feeding back this current to the bias controller. The less current or preferably substantially zero current minimizes charge damage to the device.

III. Second Example Embodiment Method and Tool Structure

Figure 2:
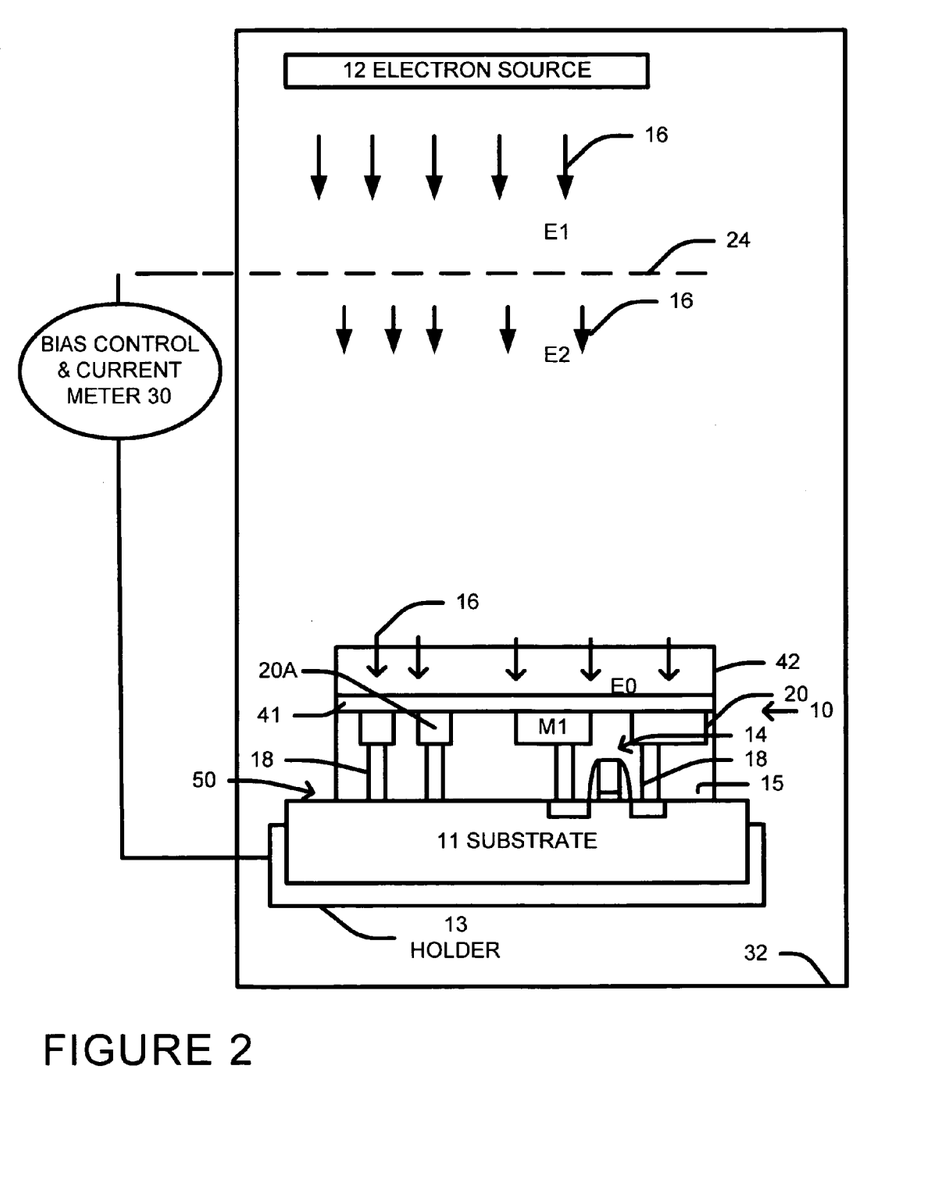
FIG. 2 is another more detailed schematic view for illustrating a tool and a method for curing a film according to an example embodiment of the present invention.

Another example structure/method of curing a film over a substrate is shown in FIG. 2.

A. Semiconductor Structure is Comprised of a Conductive Interconnect Structure and a Substrate Referring to FIG. 2, we provide a semiconductor structure 10 comprised of a conductive interconnect structure (e.g., 20) and a semiconductor substrate 11.

The semiconductor substrate 11 is preferably a silicon substrate including semiconductor wafer or substrate. The substrate can have active and passive devices formed within wafer, poly gate, inter-poly oxide etc. For example, FET device 14 (e.g., gate, gate dielectric, spacers, S/D) is shown. FET transistors can be formed in and on the substrate and under the film.

The conductive interconnect structures can be comprised of metal plugs 18 or lines 20 or dual damascene interconnects. The conductive interconnect structure can be comprised of one or more interconnect levels/layers, such as contacts, first metal levels (e.g., M1), second metal level (e.g., M2) and higher metal levels, The interconnect structure can be comprised of copper (Cu), aluminum (Al), tungsten (W), silver (Ag), gold (Au) or platinum (Pt), and is more preferably comprised of copper.

The interconnect structure can include optional cathode structures 20A. The cathode structures can be any conductive layer (s) that helps form a cathode under the dielectric layer 42. The interconnect structures and cathode structures are electrically connected to the substrate 11.

Example of existing cathode structures are passive and/or chip protection structures, such as MOB (moisture oxidation barrier), guard ring, crack-stop metal bar, Via-fill, etc. Cathode structures are described more below.

B. Holder

A substrate holder 13 can contact the substrate 11. The substrate holder, the substrate 11 and the interconnect structure (e.g. 18 20) can form a cathode structure that is connected to the Bias control and current meter 30. The holder is comprised of a conductive material.

C. Dielectric Barrier Layer

A dielectric barrier layer 41 can be formed over the interconnect structures 20 20A. If the interconnect structures are comprised of Cu, the dielectric barrier layer 41 can be a thin film layer of a Cu diffusion barrier 41. The Dielectric barrier layer is preferably comprised of SiN, SiON, SiC, SiCN, or SiOC.

D. Film

The film (e.g., dielectric layer) to be cured can be comprised a low-k dielectric layer 42 or of a photoresist material.

A low-k dielectric layer 42 can be formed over dielectric barrier layer 41 to a thickness of preferably from 800 to 15000 ANG. and more preferably from 1000 to 12000 ANG. The low-k dielectric layer is preferably comprised of carbon-doped oxide film with dielectric constant k≦3.0, and more preferably comprised of porous carbon-doped ULK (ultra low-k) film with dielectric constant k≦2.6. The low-k or ULK carbon-doped oxide is normally formed by chemical vapor deposition (CVD), and more preferably by plasma enhance CVD (PECVD). Low-k or ULK film or photoresist coated by spin-on deposition can also be cured this method. A photoresist material is a light sensitive material.

E. Contact to Substrate and Interconnect Structure

FIG. 2 shows that the top edge 50, sides and bottom of the substrate can be cleaned to remove all the coatings to allow a good electrical contact. A wet etch can be used. The substrate 11 is electrically connected to the interconnect structures which are close to the dielectric layer 42 that is being cured.

F. e-beam Tool

Still referring to FIG. 2, we provide an electron source 12, an anode floating grid 24 between the electron source 12 and the semiconductor structure 10. The electron source can be a plurality of electron tubes.

The e-beam tool can also comprise a chamber 32 that surrounds the semiconductor structure, and anode grid.

FIG. 2 shows the anode floating grid 24. Electrons are influenced by the electric field generated by the voltage on the grid 24. The anode grid 24 can be shaped like a screen mesh that allows the electrons to pass thru.

G. Feed Back Control System

A feed back control system can be used to control the energy of the electrons irradiated from the electron source using the e-current detected by the cathode structure.

FIGS. 1 and 2 show an example feed back control circuit.

A bias controller and current meter 30 are connected to the interconnect structure possibly thru the substrate holder 13, and the substrate 10. The bias controller and the current meter can be separate devices and be separately connected to the tool.

The current meter 30 is connected to an anode grid voltage controller 36 and to the anode grid. The anode grid voltage controls the voltage on the anode grid which can control the e-beam current to the semiconductor structure.

A current meter can be used to monitor the current in between anode and cathode for e-beam curing process optimization. If current is detected in between anode and cathode, potential charge damage may occur. Optimum curing process should lead to substantially 0 current in between anode and cathode.

H. Irradiating the Film Using the Cathode Feed Back Control

We cure the film 42 using ebeam. We then expose the film 42 to an electron beam 16 from the electron source 12 by controlling the energy of electron beam 16 by controlling the voltage on the and anode grid by measuring the current flow between the anode grid 25 and the interconnect structure. We control the voltage on the and anode grid to minimize the amount of electrons that penetrate totally through the film.

FIG. 2 shows the electrons 16 have a energy E1 when leaving the electron source 12. The anode grid either slows or accelerates the ions to an energy E2 so that the electrons have sufficient energy to penetrate thru the film without penetrating too far and passing thru the entire film 42 to the device interconnect (e.g., Cu) which can cause charge damage to the underlying devices (e.g., FET). FIG. 2 shows the electrons have an energy E0 as the electrons pass thru portions of the film 42. By controlling the bias, the electrons can be controlled to not pass all the way thru the film 42. E-beams can go thru the film 42 but stop before the interconnect structure 20. Only low-k film 42 needs to be e-beam cured. E-beams can go through the low-k film 42 to cure it completely. Some E-beams may go into dielectric barrier 41 also but will stop before they reach the interconnect layer 20.

The feed back loop (e.g., including the current meter) can be used to monitor the current in between anode and cathode for e-beam curing process optimization. If current is detected in between anode and cathode, that indicates some electrons reach Cu interconnect and potential charge damage may occur. Optimum curing process should lead to 0 current in between anode and cathode. Since only a small amount of electrons will reach the interconnect (e.g. Cu interconnect surface) with optimum e-beam curing process, no charge will be conduct through Cu line to accumulate on transistor to cause charge damage.

I. Cathode Structures

Figure 3:
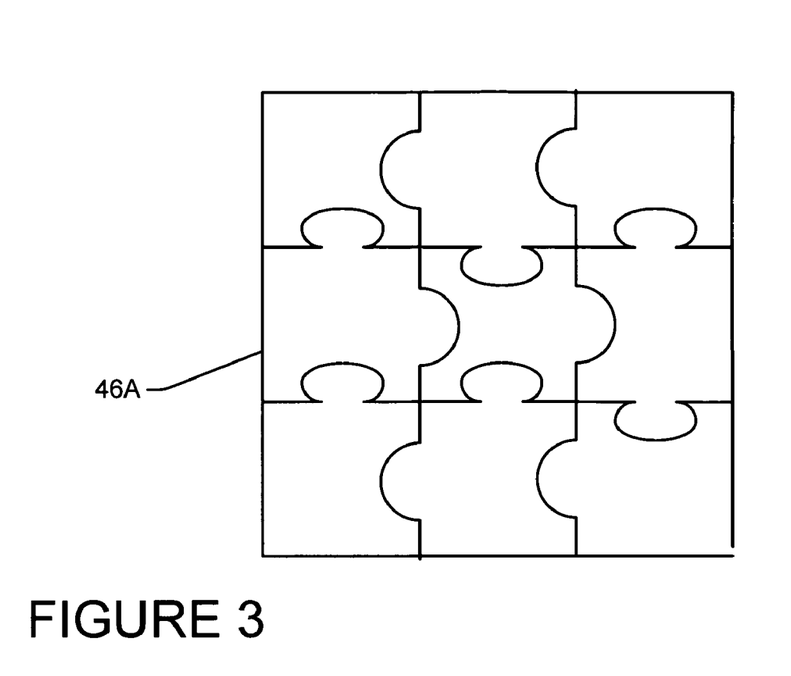
FIG. 3 is a top down view of an crack stop cathode structure according to an example embodiment of the present invention.
Figure 4A:
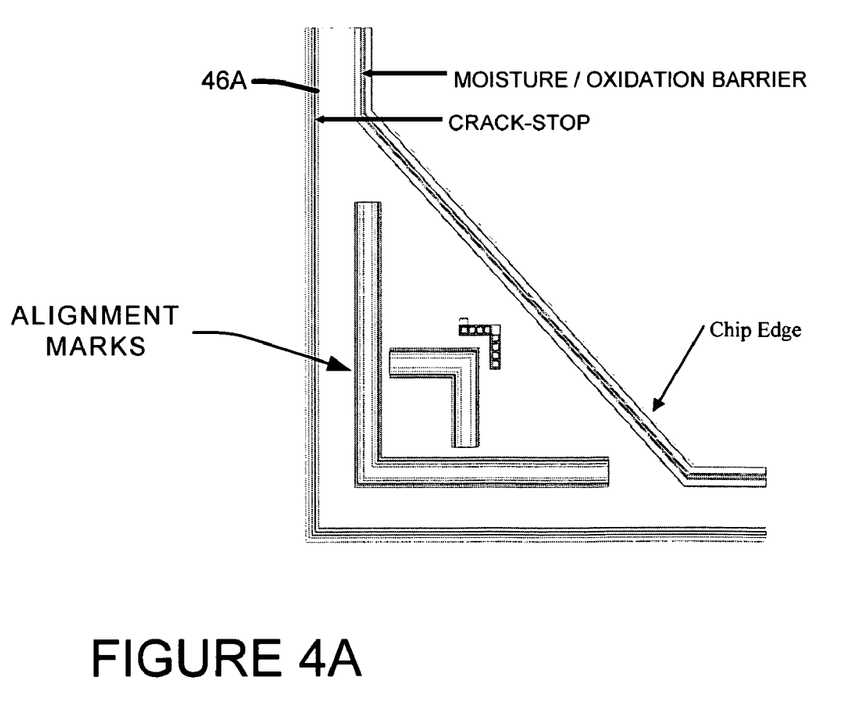
FIG. 4A is a top down view of examples cathode structure according to an example embodiment of the invention.

The cathode structures can be a structure already existing on the conductive interconnect layer or can be a specially made structure. Example of existing cathode structures are passive and/or chip protection structures, such as MOB (moisture oxidation barrier), guard ring, crack-stop metal bar, Via-fill, etc, FIGS. 3 and 4A show examples of cathode structures that already existing on the interconnect layer 20. FIG. 3 shows a top down view of an crack stop cathode structures 46A.

FIG. 4A shows a top down view a moisture/oxidation barrier at the chip edge and crack stop.

Figure 4B:
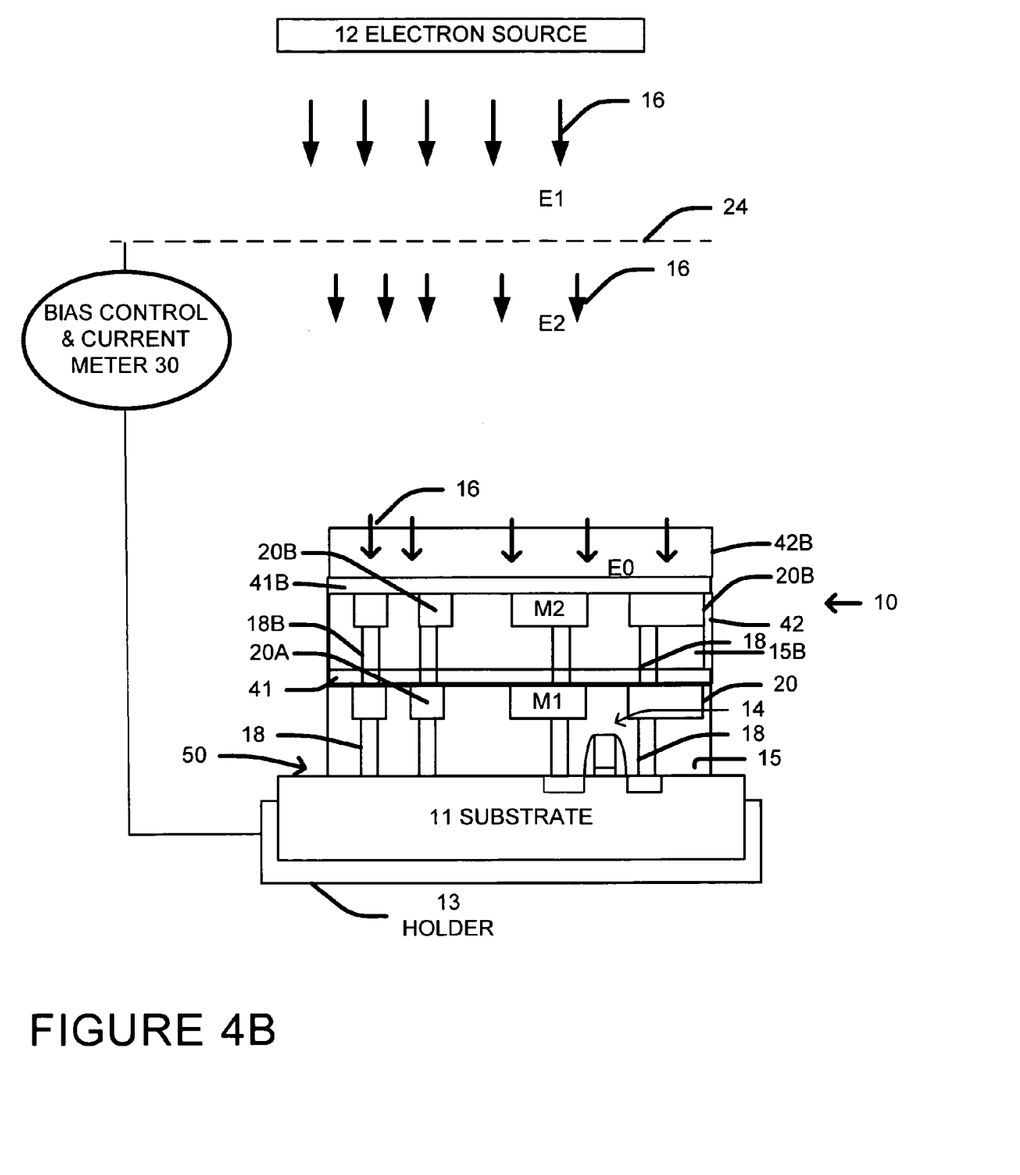
FIG. 4B shows a cross sectional view of a second level film being curried according to an example embodiment of the invention.

FIG. 4B shows a cross sectional view of a second level film (e.g., dielectric layer) 42B being curried. The dielectric baffler layer 41 is over the interconnect structure 18 20 18B 20B. The cathode structure 18 20A 18B 20B is shown on another region of the structure 10. The cathode structure could represent the crack stop 46A shown in FIG. 4A or any of the above discussed cathode structures.

The cathode structures can be a specially made structures that are not part of the original design. The Optional cathode structures 20A are "MOB, guard rings" that are not needed, but are made on the chip so that they can be used as cathode structures to improve the E-beam curing process. Many times BEOL interconnect is designed to have MOB, guard rings structure so that the device structures can be protected during dicing and packaging. In case there is not MOB, guard ring structures, we can specially build in some similar structures like MOB or guard ring to sever as cathode structures.

IV. ebeam Tool with the Feed Back System

A thin film processing system to cure dielectric layers can be comprised of:
  a) a processing chamber, an electron source 12, a device holder; an anode grid 24 between the electron source 12;
  b) the electron source adapted to send electrons thru said anode grid towards a semiconductor structure over said device holder.
  c) a controller for controlling the bias voltage between the anode grid and a semiconductor structure with an overlying film in said device holder.

The system can further include a current meter to measure the current between the anode grid 24 and the semiconductor structure.

B. Review

E-beam cured films require high enough e-beam energy and does to get cured completely and uniformly. Meanwhile the e-beam energy can't be too high. Otherwise they will punch through the low-k film and reach underneath interconnects to cause charge damage on device. The embodiments feedback control of the anode grid allows anode grid bias optimization between floating grid and cathode structures on the wafer (e.g., Cu layer). The embodiment's interconnect and cathode structures that underlie the dielectric layer provide superior feedback.

Other features of some example embodiments are:
  1. Design to use the floating grid inside the e-beam chamber as anode;
  2. Design to use the existing passive and/or chip protection structures, such as MOB (moisture oxidation barrier), guard ring, crack-stop metal bar, Via-fill, et al, on wafer as cathode; One can even specifically design some structures and build them on chips to serve as cathode structures;
  3. Apply bias between anode and cathode to form electric field to control the e-beam energy which is coming down through floating grid to organic low-k film for curing;
  4. Electric beam energy will reduce or increase when it passes through the electric field between anode and cathode.
  5. The bias is adjustable/controllable so that we can optimize the bias according to organic low-k film thickness to make sure the e-beam energy become 0 just before the e-beam reach Cu surface;
  6. A feed back loop like current meter can be used to monitor the current in between anode and cathode for e-beam curing process optimization. If current is detected in between anode and cathode, that indicates some electrons reach Cu interconnect and potential charge damage may occur. Optimum curing process should lead to 0 current in between anode and cathode;
  7. Since almost no electron will touch Cu surface with optimum e-beam curing process, no charge will be conduct through Cu line to accumulate on transistor to cause charge damage.

C. Non-limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of curing a film comprising:
   providing a semiconductor structure which comprises a substrate prepared with a cathode structure, the substrate further includes a film disposed over the substrate;
   providing an electron source and an anode grid;
   curing the film by exposing the film to an electron beam from the electron source, the electron beam passes through the anode grid,
   wherein during curing, a control circuit electrically couples the cathode structure to the anode grid to facilitate the semiconductor structure to act as a cathode; and
   monitoring current flow between the anode grid and the cathode by the control circuit,
   wherein the current flow is used to indicate potential charge damage.

2. The method of claim 1 wherein the cathode structure comprises an interconnect structure, a passive device, a chip protection structure, a moisture oxidation barrier, a guard ring, a crack-stop metal bar or a combination thereof.

3. The method of claim 1 comprises a dielectric baffler layer between the film and the cathode structure.

4. The method of claim 1 wherein:
   the cathode structure comprises an interconnect structure, a passive device, a chip protection structure, a moisture oxidation barrier, a guard ring, a crack-stop metal bar or a combination thereof; and
   a dielectric baffler layer between the cathode structure and the film.

5. The method of claim 1 wherein said film is comprised of an organic low K material with a dielectric constant less than 3.0 or a carbon doped oxide with a dielectric constant less than 3.0.

6. The method of claim 1 wherein said film is comprised of a photoresist material and the bias voltage is controlled to produce a current flow between the anode grid and the substrate that is substantially zero.

7. The method of claim 1 comprises controlling a bias voltage between the anode grid and the substrate to control a depth of the electron beam based on the current flow between the anode grid and the semiconductor structure.

8. The method of claim 3 wherein the control circuit controls a depth of the electron beam for curing the film by adjusting a bias voltage applied to the anode grid based on the current flowing between the anode grid and the cathode.

9. The method of claim 8 wherein the depth of the electron beam is controlled to minimize the amount of electrons that penetrates through the dielectric barrier layer.

10. A method of curing a film over a substrate comprising:
    providing a semiconductor structure comprising a substrate prepared with a cathode structure, the semiconductor further comprises a film over the substrate, wherein the film comprises an organic low K material with a dielectric constant less than 3.0 or a photoresist material;
    providing an electron source and an anode grid between the electron source and the semiconductor structure;
    curing the film by exposing the film to an electron beam from the electron source that passes through the anode grid,
    wherein during curing, a control circuit couples the cathode structure to the anode grid to facilitate the semiconductor structure to act as a cathode; and
    measuring current flow between the anode grid and the cathode by the control circuit,
    wherein the current flow is used to indicate potential charge damage, thereby enabling the control circuit to control a depth of the electron beam for curing the film to reduce potential charge damage.

11. The method of claim 10 wherein:
    a chamber surrounds the semiconductor structure, the anode grid and the electron source; and
    a substrate holder holds the semiconductor structure, wherein the substrate holder together with the substrate and the cathode structure act as a cathode under the film.

12. The method of claim 10 wherein a FET transistor is formed in and on the substrate and under the film.

13. The method of claim 10 wherein the cathode structure comprises an interconnect structure, a passive device, a chip protection structure, a moisture oxidation barrier, a guard ring, a crack-stop metal bar or a combination thereof.

14. The method of claim 10 wherein:
    the cathode structure comprises an interconnect structure, a passive device, a chip protection structure, a moisture oxidation barrier, a guard ring, a crack-stop metal bar or a combination thereof; and
    a dielectric baffler layer is over the cathode structure and the film is over the dielectric barrier layer, wherein the dielectric barrier layer is comprised of a material selected from the group consisting of: SiN, SiON, SiC, SiCN, or SiOC.

15. A method of forming a semiconductor device comprising:
    providing a substrate prepared with a cathode structure, the substrate is further prepared with a film over the substrate and the cathode structure;
    placing the substrate in a curing tool with an electron source and an anode grid;
    generating an electron beam from the electron source, wherein the electron beam passes through the anode grid toward the substrate to cure the film,
    wherein during curing, a control circuit electrically couples the cathode structure to the anode grid to facilitate the semiconductor structure to act as a cathode; and
    monitoring current flow between the anode grid and the cathode by the control circuit,
    wherein the current flow is used to indicate potential charge damage.

16. The method of claim 15 wherein the cathode structure comprises an interconnect structure, a passive device, a chip protection structure, a moisture oxidation barrier, a guard ring, a crack-stop metal bar or a combination thereof.

17. The method of claim 15 wherein the control circuit controls a depth of the electron beam for curing the film by adjusting a bias voltage applied to the anode grid based on the current flowing between the anode grid and the cathode.

18. The method of claim 15 wherein the film comprises a dielectric layer or a photoresist layer.

19. The method of claim 15 wherein the film comprises a low-k dielectric material with a dielectric constant of less than about 3.0 or a photoresist material.

20. The method of claim 15 wherein:
    the control circuit controls a depth of the electron beam for curing the film by adjusting a bias voltage applied to the anode grid based on the current flowing between the anode grid and the cathode; and the bias voltage is adjusted such that the depth of the electron beam is controlled to minimize electrons penetrating through the dielectric barrier layer.

21. The method of claim 15 wherein the cathode structure is connected to the control circuit via a substrate holder.

22. The method of claim 17 wherein the bias voltage is controlled to produce a current flow between the anode grid and the substrate which is substantially zero.

* * * * *